(12) United States Patent
Wimpenny et al.

(10) Patent No.: US 8,928,364 B2
(45) Date of Patent: *Jan. 6, 2015

(54) CONTROL OF CROSS-OVER POINT

(71) Applicant: Nujira Limited, Cambourne, Cambridge (GB)

(72) Inventors: Gerard Wimpenny, Cambourne (GB); Martin Paul Wilson, Cambourne (GB)

(73) Assignee: Nujira Limited (GB)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,291

(22) Filed: Jul. 8, 2013

(65) Prior Publication Data

US 2013/0293205 A1    Nov. 7, 2013

Related U.S. Application Data

(63) Continuation of application No. 13/372,891, filed on Feb. 14, 2012, now Pat. No. 8,482,322.

(30) Foreign Application Priority Data

Feb. 15, 2011   (GB) .................................. 1102643.2

(51) Int. Cl.
    *H03B 1/00*   (2006.01)
    *G05F 1/66*   (2006.01)
    *H03F 1/02*   (2006.01)
    *H03F 3/26*   (2006.01)

(52) U.S. Cl.
    CPC ................ *G05F 1/66* (2013.01); *H03F 1/0222* (2013.01); *H03F 1/025* (2013.01); *H03F 3/265* (2013.01); *H03F 2200/102* (2013.01); *H03F 2200/375* (2013.01); *H03F 2200/451* (2013.01); *H03F 2200/537* (2013.01); *H03F 2200/541* (2013.01)
    USPC ............................ 327/110; 327/108; 327/112

(58) Field of Classification Search
    USPC .................................. 327/108, 112, 109, 110
    See application file for complete search history.

(56) References Cited

U.S. PATENT DOCUMENTS

| 5,841,321 A | 11/1998 | Miyake et al. |
| 6,498,521 B1 | 12/2002 | Bicakci et al. |

(Continued)

FOREIGN PATENT DOCUMENTS

| GB | 2064907 A1 | 6/1981 |
| GB | 2457764 A | 9/2009 |

(Continued)

OTHER PUBLICATIONS

Carlos Lorenzo, "International Patent Application No. PCT/EP2012/052265 International Search Report and Written Opinion", Jun. 21, 2012, Publisher: PCT, Published in: EP.

(Continued)

*Primary Examiner* — Hai L Nguyen
(74) *Attorney, Agent, or Firm* — Kaplan Breyer Schwarz & Ottesen, LLP (57) ABSTRACT

There is provided an output stage comprising: a phase splitter for receiving an input signal and for generating first and second drive signals of opposite phase in dependence thereon; a DC offset signal generator for generating a DC offset signal; an adder for adding the DC offset signal to the first drive signal to provide a first modified drive signal; a subtractor for subtracting the DC offset signal from the second drive signal to provide a second modified drive signal; a first drive transistor associated with a first power supply voltage, for generating a first output signal in dependence on the first modified drive signal; a second drive transistor associated with a second power supply voltage, for generating a second output signal in dependence on the second modified drive signal; and a combiner for combining the first and second output signals to generate a phase combined output signal.

20 Claims, 8 Drawing Sheets

(56) References Cited

U.S. PATENT DOCUMENTS

| | | | |
|---|---|---|---|
| 6,937,093 B2 | 8/2005 | Tekushan | |
| 7,994,826 B2 | 8/2011 | Ishikawa et al. | |
| 8,482,322 B2 * | 7/2013 | Wimpenny et al. | 327/110 |
| 2008/0104432 A1 | 5/2008 | Vinayak et al. | |
| 2010/0039175 A1 | 2/2010 | Dasgupta | |

FOREIGN PATENT DOCUMENTS

| | | |
|---|---|---|
| WO | 2006123350 | 11/2006 |
| WO | 2008054906 A3 | 5/2008 |
| WO | 2008112041 A3 | 9/2008 |

OTHER PUBLICATIONS

"GB Application No. GB1102643.2 Search Report", Jun. 14, 2011, Publisher: Intellectual Property Office, Published in: GB.

Carlos Lorenzo, "International Patent Application No. PCT/EP2012/052265", "International Preliminary Report on Patentability and Written Opinion", Aug. 29, 2013, Publisher: PCT, Published in: EP.

* cited by examiner

CONTROL OF CROSS-OVER POINT

CROSS-REFERENCE TO RELATED APPLICATIONS

U.S. patent application Ser. No. 13/372,891, filed Feb. 14, 2012 now U.S. Pat. No. 8,482,322, and Patent application GB 1102643.2, filed Feb. 15, 2011, are incorporated herein by reference.

FIELD OF THE INVENTION

The present invention relates to the provision of a drive signal for an output stage comprising a push-pull arrangement. The invention is particularly, but not exclusively, concerned with such an arrangement in which the drive signal for the output stage is asymmetrical.

BACKGROUND OF THE INVENTION

Output stages comprising push-pull arrangements are well-known in the art. A drive signal is typically provided to the input of such an output stage, the output stage generating an output signal which represents an amplified version of the drive signal. A known exemplary prior art output stage arrangement in which a transformer is used as a combiner is illustrated in FIG. 1.

Figure 1:
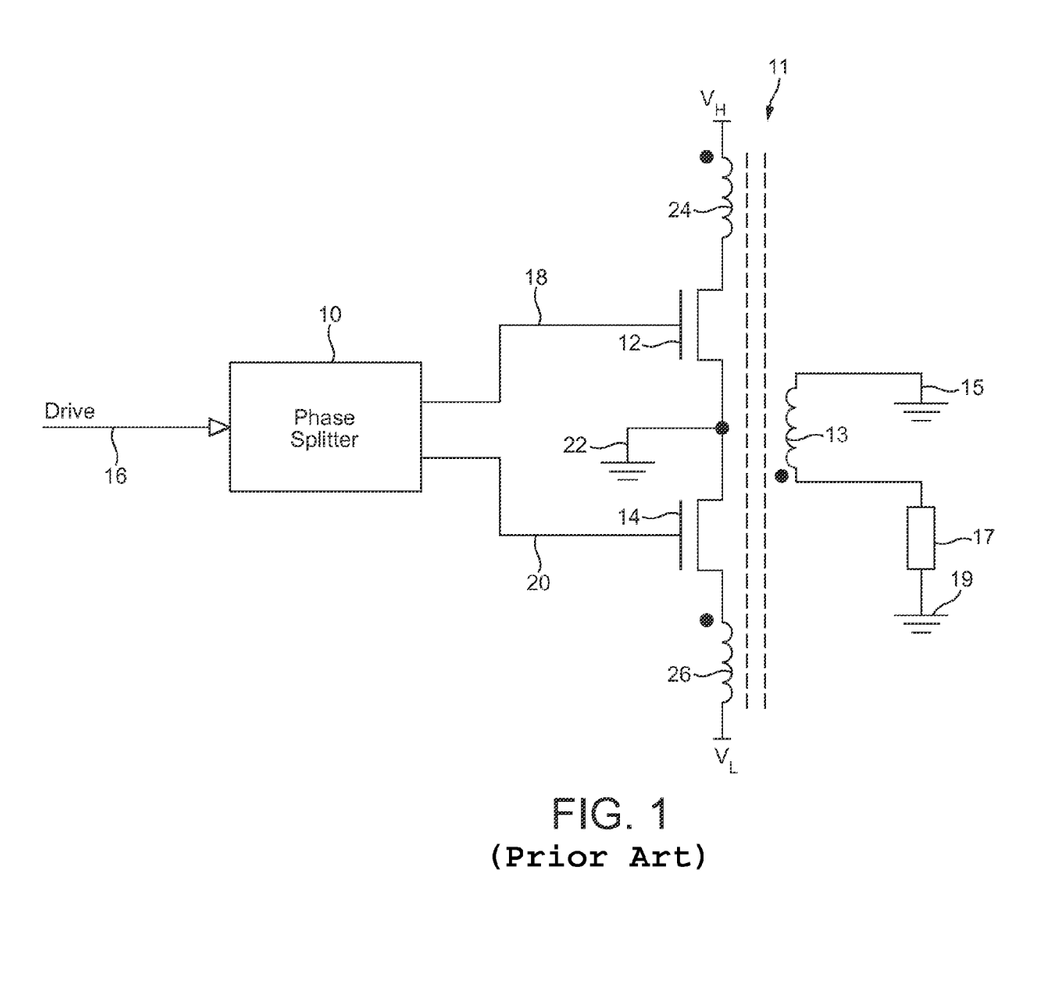
FIG. 1 illustrates an output stage in accordance with the prior art.

As illustrated in FIG. 1, the output stage comprises a pair of transistors 12 and 14, and a phase splitter 10. A drive signal is provided on an input line 16 to the input of the phase splitter 10. The phase splitter 10 splits the drive signal on line 16 into two phases (0° and 180°), each of which is delivered on respective output lines 18 and 20 of the phase splitter 10. The respective phases of the drive signal on lines 18 and 20 are connected to the control nodes of the transistors 12 and 14 respectively. The transistors 12 and 14 in the illustrative example of FIG. 1 are FET devices, and the control nodes are therefore the gates of the FETs. The transistor 12 amplifies portions of the input waveform and its drain is connected to a supply voltage $V_H$ via a primary winding of a transformer 11. The transistor 14 amplifies low voltage portions of the input waveform and its drain is connected to supply voltage $V_L$ via another primary winding 26 of the transformer 11. The source of each transistor 12 and are commonly connected to an electrical ground 22. In general, $V_H \neq V_L$, and $V_H > V_L$.

A winding 13 of a secondary side of the transformer 11 is connected between electrical ground 15, and one terminal of an output load 17. The other terminal of the output load 17 is connected to electrical ground at node 19.

Figure 2:
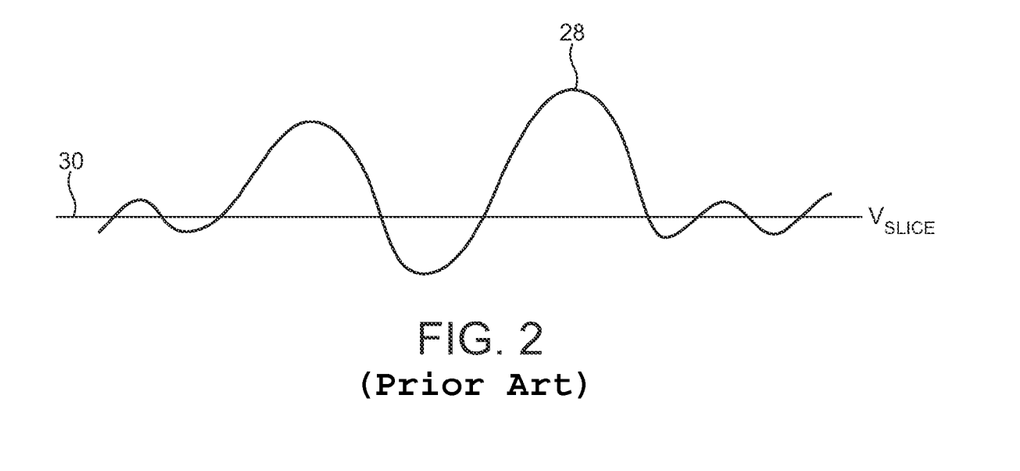
FIG. 2 illustrates a non-symmetric drive signal for the output stage of FIG. 1.

In FIG. 2 there is illustrated an example asymmetric waveform plot of voltage against time which voltage may typically form the drive signal DRIVE on line 16. As illustrated in FIG. 2, the drive signal denoted by reference numeral 28 is asymmetrical with respect to a DC slice voltage $V_{SLICE}$ denoted by horizontal line 30. The slice voltage $V_{SLICE}$ represents the cross-over point or slicing point between the two halves of the output stage comprising the transistors 12 and 14 in processing such a drive signal in prior art arrangements. In general, the portions of the drive signal above the slicing voltage $V_{SLICE}$ as denoted by line 30 are handled by the high-side transistor 12, and the portions of the drive signal below the slicing voltage $V_{SLICE}$ 30 are handled by the low-side transistor 14. Thus one half of the output stage amplifies the signal above the crossing point 30, and the other half of the output stage amplifies the signal below the crossing point 30.

Figure 3:
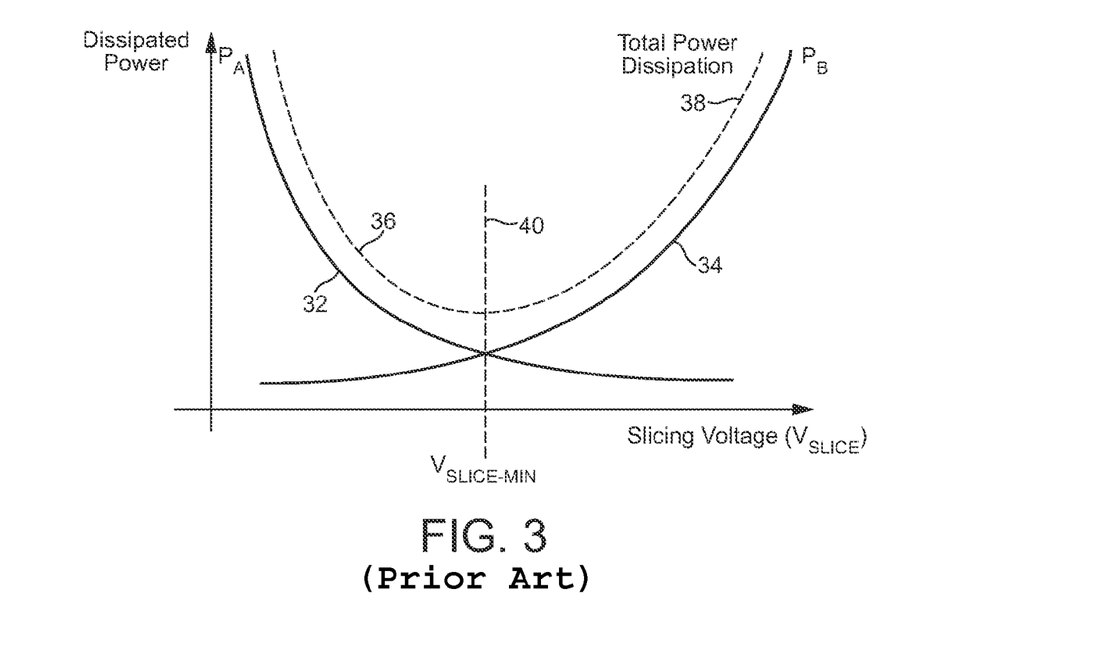
FIG. 3 illustrates the distribution of power dissipated in the two halves of an output stage in accordance with the location of a crossover or slicing point.

Illustrated in FIG. 3 is a plot of dissipated power against slicing voltage for the two transistors 12 and 14 of the output stage in the prior art arrangement of FIG. 1. The plotted curve 32 denotes the power dissipated in the transistor 12, denoted $P_A$. The plotted curve 34 denotes the power dissipated in the transistor 14, denoted $P_B$. The plotted dashed line 36 denotes the total power dissipated in the output stage comprising the transistors 12 and 14 in combination. In an ideal scenario, the crossing point or slicing point is determined to minimise the total power dissipated by the transistors 12 and 14. This occurs when the power dissipated in transistors 12 and 14 is equal. Thus as illustrated in FIG. 3, in the ideal scenario the crossing point is defined by a slicing voltage $V_{SLICE\_MIN}$, denoted by a horizontal line 40 which passes through the intersection of the plots 32 and 34. This represents the point at which half of the power in the output stage is handled by the transistor 12, and half of the power in the output stage is handled by the transistor 14.

It should be noted that in the above description there is discussed dissipation of power in the transistors 12 and 14. Power may also be dissipated—at least in part—in the transformer which forms part of the output stage. As the transformer is an example of a combiner stage, in general the power dissipated in the output stage is sum of the power dissipated in the drive transistors and power dissipated in the combiner.

The object of the invention is to maximise the efficiency of an output stage for any waveform statistics.

SUMMARY OF THE INVENTION

The invention provides an output stage comprising: a phase splitter for receiving an input signal and for generating first and second drive signals of opposite phase in dependence thereon; a DC offset signal generator for generating a DC offset signal; an adder for adding the DC offset signal to the first drive signal to provide a first modified drive signal; a subtractor for subtracting the DC offset signal from the second drive signal to provide a second modified drive signal; a first drive transistor associated with a first power supply voltage, for generating a first output signal in dependence on the first modified drive signal; a second drive transistor associated with a second power supply voltage, for generating a second output signal in dependence on the second modified drive signal; and a combiner for combining the first and second output signals to generate a phase combined output signal, wherein the DC offset signal is generated in order to equalise the power dissipated in the first and second transistors.

The output DC offset signal generator may be arranged to measure the power dissipated in the two drive transistors and to determine the difference between said measurements, and the DC offset signal is generated in dependence on said difference. Each drive transistor may be an FET, the drain of each FET being connected to the combiner and the source of each FET being connected to ground, and the gate of each respective FET being arranged to receive the respective modified drive signal.

The drive transistors may be connected to their respective supply voltages via the combiner.

The output stage may further comprise a measurement block adapted to determine a value representing the power dissipated in each drive transistor. The measurement block may be adapted to measure each supply voltage. The measurement block may be adapted to measure the current flowing in each drive transistor. The measured current and voltage may be multiplied to provide a power value. The measurement block may comprise two measurement blocks, one associated with each drive transistor.

The output stage may further comprise a subtractor for calculating the difference between the power dissipated in each drive transistor, which difference represents an error of the difference between the dissipated power in the drive transistors. The output stage may further comprise an error integrator for integrating the error signal, wherein the integrated error signal is provided as the offset signal which is respectively added to or subtracted from the drive signals of the two drive transistors.

The combiner may comprise a transformer.

The transformer may comprise first and second windings on a first side thereof, one connected between the first drive transistor and the first power supply voltage and the other connected between the second drive transistor and the second power supply voltage, the transformer further comprising a winding on a second side thereof, wherein a voltage is developed in the winding of the second side in dependence of the voltages in the first and second windings.

The invention provides an envelope tracking power supply comprising: an envelope detector for receiving an input signal to be amplified and for generating an envelope signal representing the envelope of said signal; a switched mode power supply for selecting one of a plurality of power supply voltages for output as a switched mode power supply in dependence on said envelope signal; a transformer have a first tap of a second winding for connection to the selected switched mode power supply, and a second tap of the second winding for providing an output signal; a subtractor for receiving the envelope signal and the output signal and for generating a drive signal representing the difference between such; a first drive transistor connected to a first power supply voltage via a first winding of a first side of the transformer; a second drive transistor connected to a second power supply voltage via a second winding of the first side of the transformer; a phase splitter for receiving the drive signal and generating two parts of the drive signal of opposite phases for driving the first and second drive transistors respectively; a power measurement block for generating a value representing the power dissipated in each of the drive transistors; a difference block for generating a signal representing the difference between the generated values representing the power dissipated in each of the drive transistors; a DC offset signal generator arranged to generate a DC offset signal in dependence on the difference between the generated values; an adder for adding the DC offset signal to the drive signal for the first transistor to provide a modified drive signal for the first transistor; a subtractor for subtracting the offset signal from the drive signal for the second transistor to provide a modified drive signal to the second transistor; and a power amplifier for receiving the input signal to be amplified at an input terminal, for receiving the output signal at a power supply terminal, and for amplifying the input signal in to provide an amplified output version thereof.

The invention also provides a method of generating an output signal in an output stage comprising: receiving an input signal and generating first and second drive signals of opposite phase in dependence thereon; generating a DC offset signal; adding the DC offset signal to the first drive signal to provide a first modified drive signal; subtracting the DC offset signal from the second drive signal to provide a second modified drive signal; generating a first output signal, in a first drive transistor associated with a first power supply voltage, in dependence on the first modified drive signal; generating a second output signal, a second drive transistor associated with a second power supply voltage, in dependence on the second modified drive signal; and combining the first and second output signals to generate a phase combined output signal, wherein the DC offset signal is generated in order to equalise the power dissipated in the first and second transistors.

BRIEF DESCRIPTION OF THE DRAWINGS

The invention is now described by way of example with reference to the accompanying drawings in which.

DESCRIPTION OF THE PREFERRED EMBODIMENTS

The invention is described herein by way of reference to exemplary embodiments, and in particular exemplary embodiments which are chosen for their suitability in presenting a clear explanation of the invention. One skilled in the art will appreciate that the invention is not limited to the details of any described example implementation, and the invention may be more broadly applied than the embodiments described herein. In particular the invention may be applied in various implementations beyond implementations discussed herein.

With reference to FIGS. 4a to 4d, there is illustrated the voltages and currents in the output stage transistors 12 and 14 of FIG. 1 in a typical operation. The invention is particularly applicable to arrangements which are required to handle a drive signal which is asymmetric. However the invention may also be used in implementations where the drive signal is symmetric. For the purposes of discussing the currents and voltages in the prior art arrangement of FIG. 1, in FIGS. 4a to 4d an example is discussed in which the drive signal provided on line 16 is a symmetric signal, in order to simplify the explanation. More particularly, the typical operation described for the purposes of example is an idealised Class B operation, in which each active element works in its linear range half of the time and in the other half of the time is turned off. In a typical Class B arrangement, there are two output devices each of which conducts for exactly half a cycle (180°) of the input signal. In the example of FIG. 1, the transistors 12 and 14 are such active devices.

Figure 4:
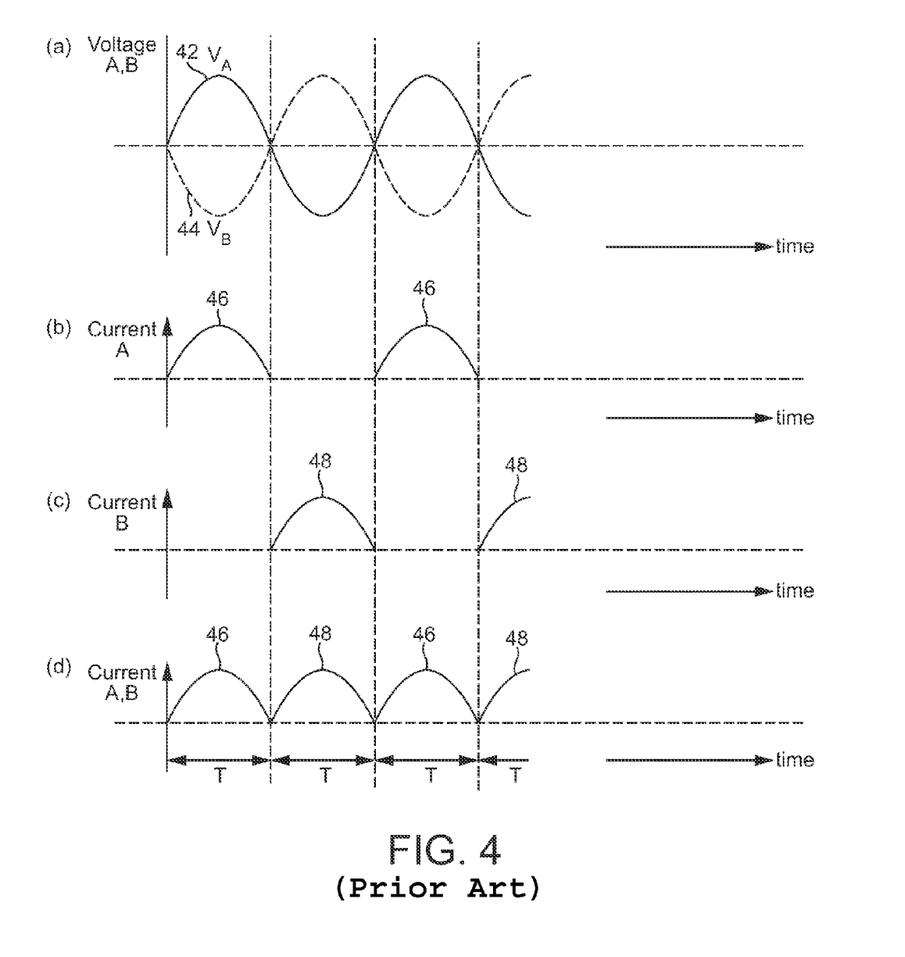
FIGS. 4a to 4d illustrate the currents and voltages in the output stage in the prior art arrangement of FIG. 1, in handling a symmetrical drive signal.

With reference to FIG. 4a, there is illustrated the voltages in the upper and lower half of the output stage. The voltage $V_A$ denoted by reference numeral 42 represents the voltage supplied on signal line 18 to the transistor 12 with respect to the threshold voltage of the transistor 12, and the voltage $V_E$, denoted by reference numeral 44 represents the voltage delivered on signal line 20 to the transistor 14 with respect to the threshold voltage of the transistor 14. Thus the horizontal dashed line in FIG. 4(a) represents the point at which the transistors 12 and 14 turn on/off as the input waveform crosses it. The waveforms 42 and 44 represent opposite phases of the same signal, and are the waveforms generated as a result of the operation of the phase splitter 10.

With reference to FIG. 4b, there is illustrated the current in the upper half of the output stage. As illustrated in FIG. 4b, a current, as denoted by waveform 46, is present only when the waveform voltage 42 is positive.

FIG. 4c represents the current in the lower half of the output stage of FIG. 1. As illustrated in FIG. 4c a current as represented by waveform 48 is only present when the waveform 44 is positive.

The waveform of FIG. 4d illustrates the combined current in the upper and lower halves of the output stage, i.e. the combination of the currents shown in FIGS. 4b and 4c, which is the same in each time period as a result of the symmetrical nature of the arrangement. The symmetrical nature of the arrangement means that each transistor is switched "on" for an equal amount of time T.

FIGS. 4a to 4d represent the case when an idealised symmetric signal is provided as the drive signal for a Class B arrangement, and as such the power in the output stage is equally distributed between the upper half and lower half of the output stage. The slicing voltage for the waveforms of FIGS. 4a to 4d is the slicing voltage $V_{SLICE\_MIN}$ of FIG. 3, in the position represented by the line 40 of FIG. 3.

Figure 5:
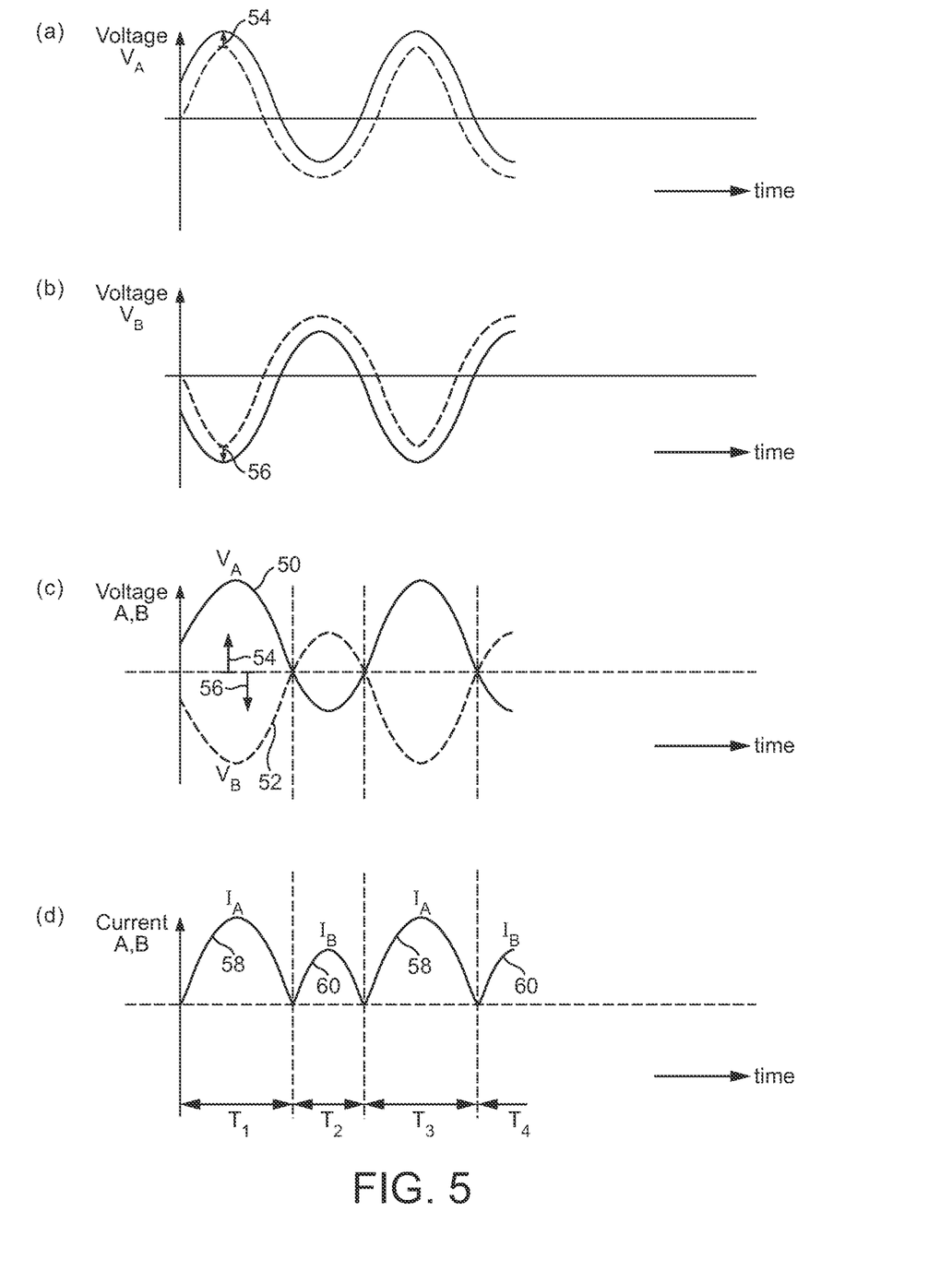
FIGS. 5a to 5d illustrate the voltages and currents in an output stage in dependence on a symmetric input in accordance with the invention.

FIGS. 5a and 5b illustrate the adaptation of the waveforms of FIGS. 4a to 4d in accordance with the principles of an embodiment of the present invention.

In accordance with the principles of the invention, a DC offset is added to the voltages at the inputs to the respective transistors 12 and 14, in order to offset the position of the voltage waveforms 42 and 44 of FIG. 4a. As will be explained further hereinbelow, the addition of the offsets to these voltages has the functional effect of controlling the effective position of the slicing voltage $V_{SLICE}$ to ensure that the dissipated power is reduced, and as best as possible minimised.

As illustrated in FIG. 5a, the voltage waveform $V_A$ denoted by reference numeral 50, is positively offset by an amount $V_{OFF}$ as indicated by the upward arrow denoted by reference numeral 54.

As illustrated by FIG. 5b, the voltage waveform $V_E$, of the lower half of the output stage is negatively offset by the same offset voltage $V_{OFF}$, as indicated by the downward arrow denoted by reference numeral 56.

FIG. 5c illustrates the overall effect of the offsets applied to the voltage waveforms, in direct comparison to the voltage waveforms of FIG. 3a.

As can be seen in FIG. 5a, the waveform $V_A$ has moved up, and the waveform $V_E$, has moved down, such that the crossover point at which the two waveforms $V_A$ and $V_E$, cross over is adjusted. As a result of the adjustment in the voltages, the upper transistor 24 is "on" for a time $T_1$, where $T_1 > T$. The lower transistor 14 is "on" for a time $T_2$, where $T_2 < T$.

Turning to FIG. 5d, it can then be seen that the current provided by the two halves of the output stage thus differs. In the time period $T_1$, the current $I_A$ is denoted by waveform 58 in the upper output stage. In the time period $T_2$, the current $I_B$ of the lower half of the output stage is denoted by waveform 60. As can be seen, the current drawn by the upper output stage is higher than that drawn by the lower output stage, and current is drawn by the upper half of the output stage for a longer period of time than it is drawn by the lower half of the output stage.

The addition of equal and opposite DC offsets to the upper and the lower halves of the output stage drive voltages, is functionally equivalent to moving the crossover point or slicing voltage denoted by reference numeral 30 in FIG. 2. As a consequence of this effective adjustment of the slicing voltage the power dissipation in transistor 12 is increased and the power dissipation in transistor 14 is decreased.

The discussion with respect to FIGS. 4a to 4d and 5a to 5d represents the case where the drive input is a symmetric waveform. As noted, the invention is most usefully applicable in arrangements where the drive signal is asymmetric. In such an arrangement and with reference to FIG. 5d, each time period in which the upper transistor 12 is on will be duration T1 (i.e. T3=T1), and each time period in which the lower transistor 14 is on will be equal to time T2 (i.e. T4=T2).

Figure 6:
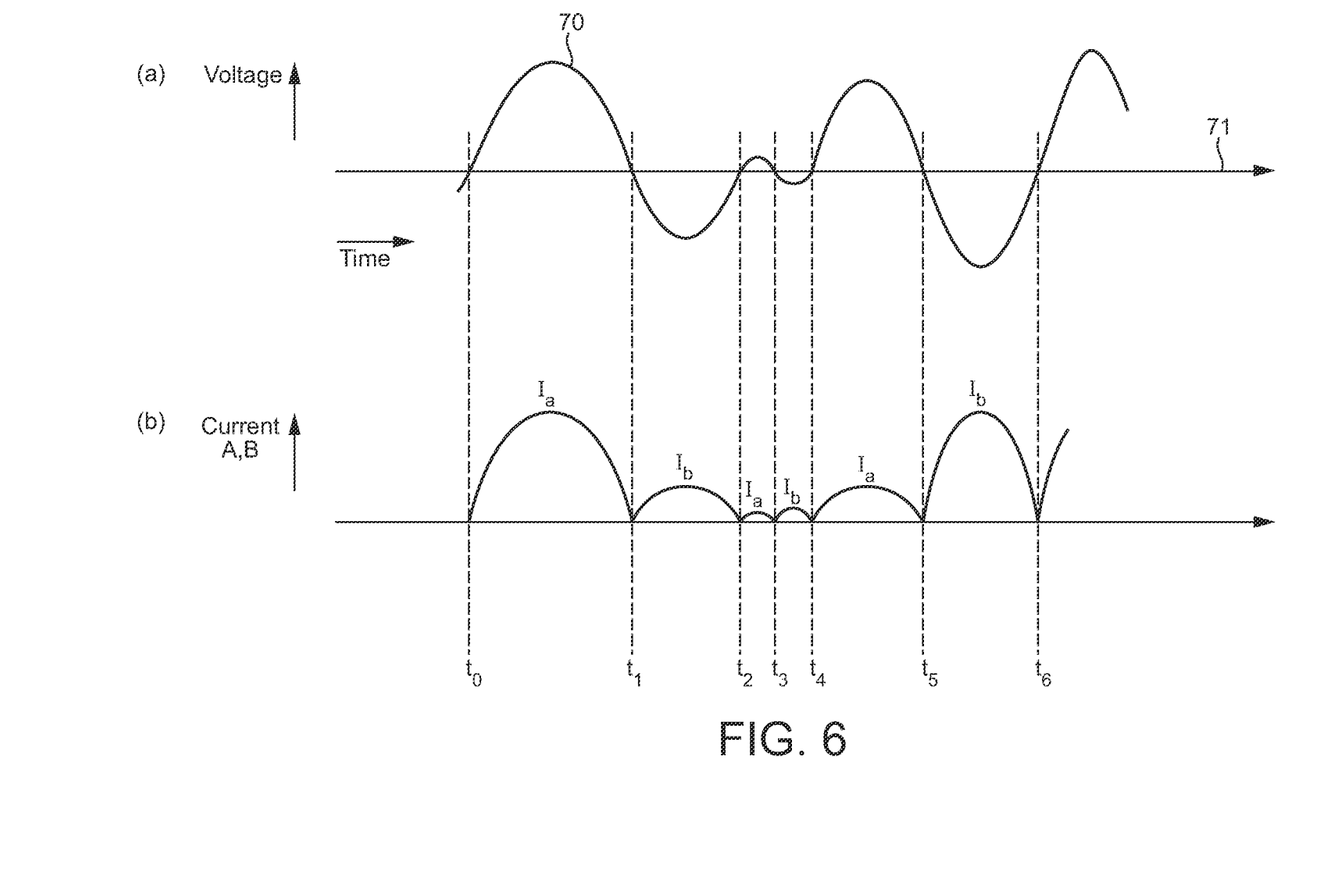
FIGS. 6a and 6b illustrate the voltages and currents in an output stage for a non-symmetric input in accordance with the invention.

FIG. 6a illustrates a waveform 70 having an asymmetric amplitude distribution. FIG. 6b illustrates the corresponding current drawn in the upper and lower halves of the output stage as the waveform 70 of FIG. 6a crosses the crossover point or slicing point denoted by horizontal line 71. By applying an appropriate DC offset to the waveform, the current drawn in each half of the output stage, and consequently the power dissipated in each half of the output stage, can be controlled in accordance with the principle described with reference to FIGS. 5a to 5d.

Figure 7:
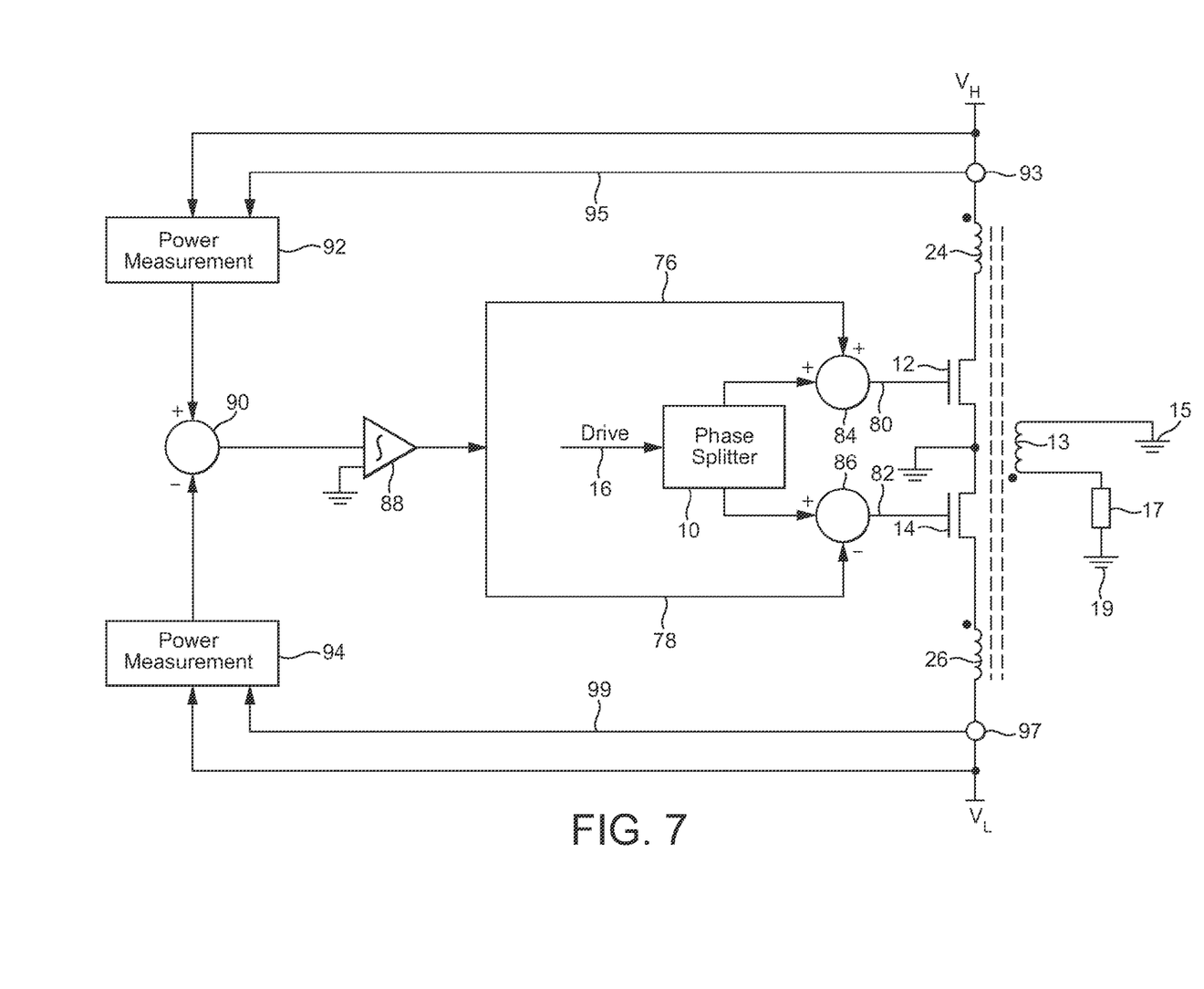
FIG. 7 illustrates an output stage adapted in accordance with an embodiment of the invention.

With reference to FIG. 7, there is illustrated a modification to the output stage arrangement of FIG. 1 in a preferred embodiment of the invention, in order to achieve the beneficial effects of the invention as described herein. Where reference numerals in FIG. 7 correspond to reference numerals in FIG. 1, they denote elements which correspond to elements of FIG. 1.

The output stage arrangement of FIG. 1 is adapted, with reference to FIG. 7, to include an adder 84, a subtractor 86, power measurement stages 92 and 94, a subtractor 90, and an error integrator 88.

The outputs of the phase splitter 10 of FIG. 1, on lines 18 and 20 respectively, form first inputs to the respective adder and subtractor, 84 and 86. The outputs of the respective adder and subtractor 84 and 86 on lines 80 and respectively form the inputs to the control nodes, or gates, of the transistors 12 and 14.

The power measurement stage 92 receives as its inputs the high voltage supply $V_H$ and the current flowing in transistor 12, as detected by current sense node 93 and delivered on signal line 95. Similarly power measurement stage 94 receives as its inputs the low voltage supply $V_L$ and the current flowing in transistor 14, as detected by current sense node 97 and delivered on signal line 99. The current flowing in the transistors 12 and 14 may be sensed in either their drain or their source (or collector/emitter for bipolar devices), and is shown as being sensed in the drains in FIG. 7 by way of example only.

Each of the power measurement stages 92 and 95 are arranged to provide on their respective outputs, on lines 93 and 95, signals representative of the average power delivered from the respective high and low voltage supply rails. The power delivered from the supply rails is a proxy for the power dissipated in the output transistors 12 and 14. The power is measured, rather than just measuring current, because the supply voltages are in general not equal to one another.

The voltages representing the output powers on lines 93 and 95 are provided as inputs to the subtractor 90, which provides an error signal on its output representing the difference in power dissipated in transistors 12 and 14 (one power measurement output is subtracted from the other).

This error signal is integrated in the error integrator 88. The error integrator 88 receives the error signal from subtractor 90 as one input and electrical ground as another input. The error integrator 88 compares the error value with zero (electrical ground) and integrates the difference.

The integrated error signal provided by the error integrator 88 is provided as an input to the adder 84 and the subtractor 86. The adder 84 also receives as an input the drive signal for the transistor 12. The subtractor 86 also receives as an input the drive signal for the transistor 14. Thus the error signal is added to the drive signal on line 18 and subtracted from the drive signal on line 20, to provide an offset drive signal voltage on line 80 for transistor 12, and an offset drive signal voltage on line 82 for transistor 14.

The arrangement shown in FIG. 7 therefore implements a closed loop control system which equalises the power dissipated in transistors 12 and 14. This is an adaptive arrangement, such that the offset is dynamically adjusted in dependence on the average power dissipated in transistors 12 and 14.

Figure 8:
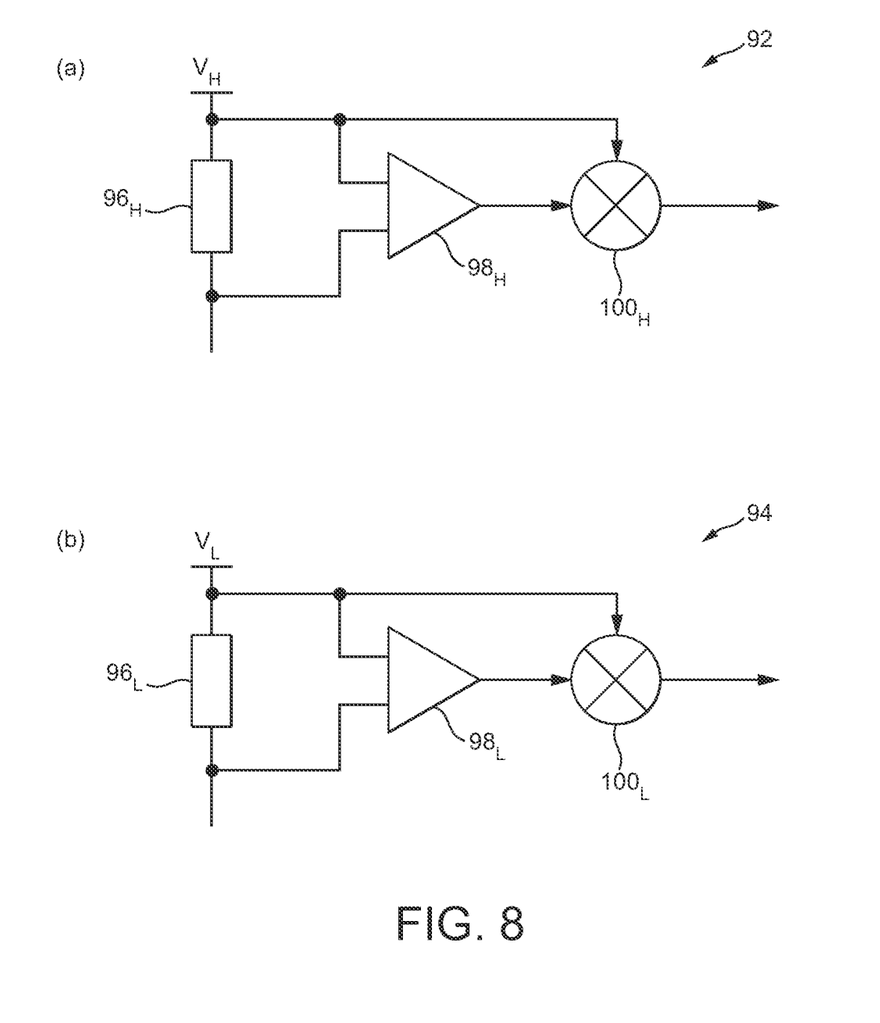
FIGS. 8a and 8b illustrate the implementation of parts of the output stage of FIG. 7 in accordance with embodiments of the invention.

With reference to FIG. 8, there is illustrated an exemplary implementation of the power measurement circuits 92 and 94 of FIG. 7. FIG. 8a illustrates the power measurement circuit 92 and FIG. 8b illustrates the power measurement circuit 94. The power measurement circuits of FIG. 8a and FIG. 8b are constructed identically.

As illustrated, each of the power measurement circuits 92 and 94 includes a sense resistor, $96_H$ and $96_L$, having one terminal connected to the respective supply voltage $V_H$ and $V_L$, and the other terminal connected to respectively the drain of the transistor 12 and the drain of the transistor 14. A voltage amplifier, respectively denoted by reference numeral $98_H$ and $98_L$ has a pair of inputs connected across the respective sense resistors $96_H$ and $96_L$. Thus the voltage amplifiers $98_H$ and $98_L$ generate on their outputs a voltage signal representing the current through the respective sense resistors $96_H$ and $96_L$.

The outputs of the voltage amplifiers $98_H$ and $98_L$ are provided as first inputs to respective multipliers $100_H$ and $100_L$. The second inputs to the respective multipliers $100_H$ and $100_L$ are taken from the respective supply voltage levels $V_H$ and $V_L$. The outputs of the respective multipliers $100_H$ and $100_L$ provide a signal representing the power dissipated in the respective output transistors 12 and 14. The power drawn from the rails is measured, which is a proxy for the power dissipated in the drive transistors 12 and 14.

Figure 9:
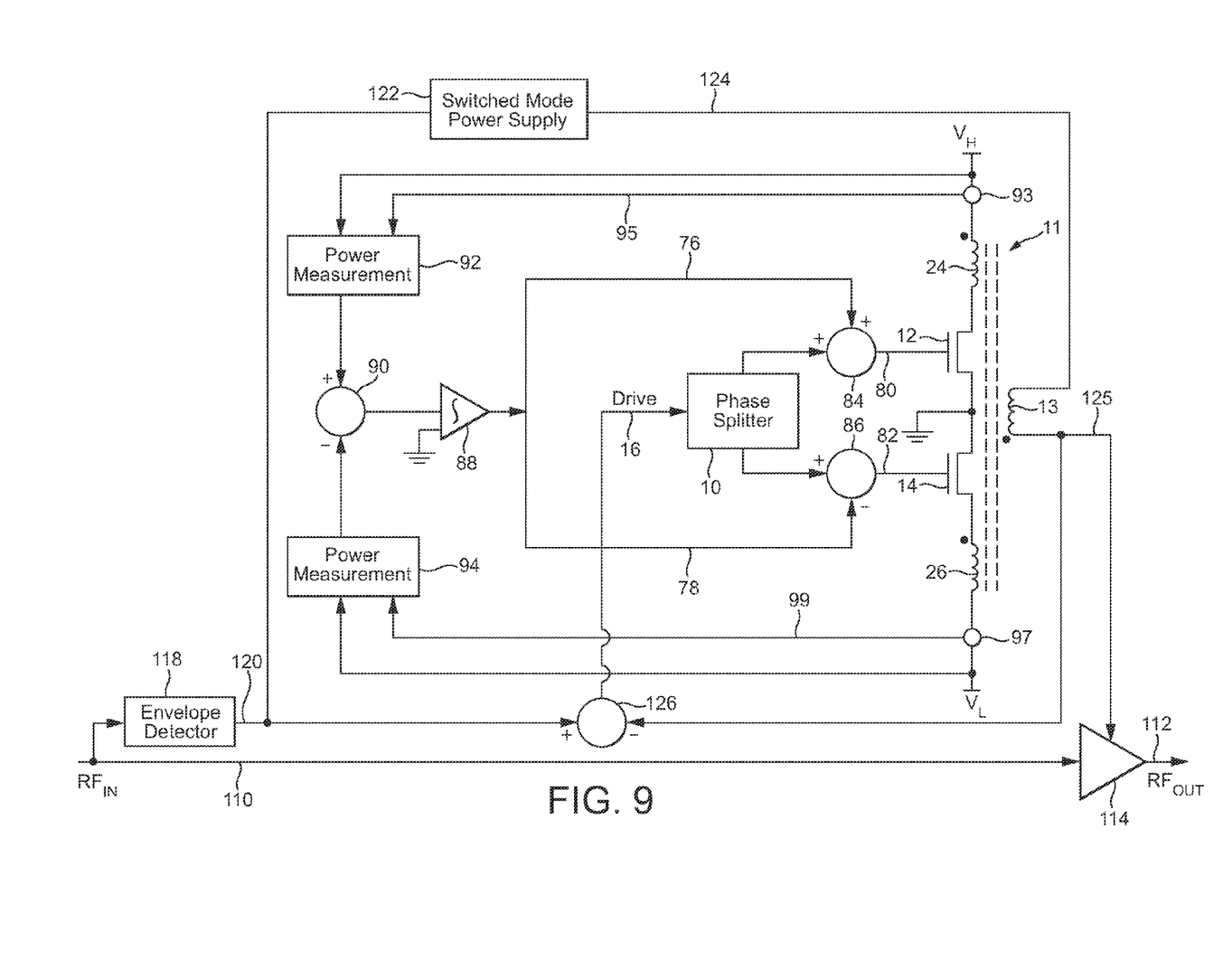
FIG. 9 illustrates an exemplary implementation of an output stage in accordance with the invention in an envelope tracking modulated power supply for an RF amplifier.

FIG. 9 illustrates an envelope tracking modulated power supply for an RF amplifier incorporating the output stage of the preferred embodiment of the invention described above with reference to FIG. 7.

As can be seen, in FIG. 9 there is further illustrated an RF input signal $RF_{IN}$ on line 110 representing an RF signal to be amplified. This is provided as an input to an RF power amplifier 114. The RF power amplifier generates an amplified RF output signal $RF_{OUT}$ on line 112.

The RF input signal $RF_{IN}$ on line 110 is provided as an input to an envelope detector 118. The envelope detector provides an envelope signal representing an envelope of the RF input signal $RF_{IN}$ on line 120. Alternatively the envelope signal could be generated from the baseband I and Q data. The envelope signal is provided as an input to a switched mode power supply 122.

The switched mode power supply generates a voltage on its output on line 124, by selecting one of a plurality of available supply voltage levels in dependence on the current amplitude of the envelope signal. This switched mode voltage is connected to one tap of the winding 13 on the second side of the transformer 11.

The transformer 11 combines the voltage generated by the output stage provided at the primary windings of the transformer 11 with the switched mode supply voltage provided at one tap on the secondary winding on line 124, such that an output is provided at the other tap of the secondary winding on line 125 which represents the switched mode supply voltage adjusted or modulated by a correction or error voltage provided by the output stage.

The envelope signal on line 120 is additionally provided as a first input to a subtractor 126. A second input of the subtractor is provided by the output voltage from the transformer 11 at the other tap of the secondary winding 13 on line 126. Thus the output stage, comprised of transistors 12 and 14 and transformer windings 24 and 26, receives as a drive input signal a signal representing the error between the generated output signal and the envelope signal, which the output signal is intended to track. The output stage provides this error signal for combining with the switched mode output voltage on line 124, to generate a corrected output voltage on line 126.

The corrected supply voltage on line 125 provides an envelope tracked power supply for the RF amplifier 114.

It will be understood by one skilled in the art that the arrangement of FIG. 7 represents a simplified implementation of an envelope tracked modulated power supply. For example the signal fed back to the subtractor 126 from line 125 may be scaled. Filter stages may be required in the envelope signal paths to the switched mode power supply and to the output stage comprising transistors 12 and 14. A filter may be required at the output of the switched mode power supply 122.

In the foregoing description reference to the output stage and power dissipated in the output stage includes reference to the drive transistors and reference to any element of the combiner which is used to combine the signals generated by the drive transistors, which elements contribute to dissipated power. In the described embodiment the combiner is identified as a transformer, and the primary windings to which the drive transistors are connected may also contribute to the dissipation of power. However in general the invention is not limited to the use of a transformer as a combiner.

The invention has been described herein by way of general reference to an output stage comprising a push-pull arrangement, which receives a drive signal which is split into two phases for delivery to the two halves of the push-pull output stage. The invention may be applied therefore in any arrangement in which a push-pull arrangement is utilised, particularly but not exclusively where the push-pull arrangement is provided with a drive signal which is asymmetric.

The invention is not limited to the FET implementations described, and may be implemented using bipolar transistors.

Particular advantageous implementations of the invention may exist, such as the implementation in an envelope tracking power supply for an RF (radio frequency) amplifier as discussed hereinabove.

The invention is described herein by way of reference to particular embodiments, but one skilled in the art will appreciate that the invention is not limited to the details of any such embodiments. The scope of the invention is defined by the appended claims.

What is claimed is:
1. An output stage comprising:
   a phase splitter for receiving an input signal and for generating first and second drive signals of opposite phase in dependence thereon;

a DC offset signal generator for generating a DC offset signal;

an adder for adding the DC offset signal to the first drive signal to provide a first modified drive signal;

a subtractor for subtracting the DC offset signal from the second drive signal to provide a second modified drive signal;

a first drive transistor associated with a first power supply voltage, for generating a first output signal in dependence on the first modified drive signal; and a second drive transistor associated with a second power supply voltage, for generating a second output signal in dependence on the second modified drive signal;

wherein the DC offset signal is generated in order to equalise the power dissipated in the first and second transistors.

2. The output stage of claim 1, wherein the DC offset signal generator is arranged to measure the power dissipated in the two drive transistors and to determine the difference between said measurements, and the DC offset signal is generated in dependence on said difference.

3. The output stage of claim 2 wherein each drive transistor is an FET, the drain of each FET being connected to the combiner and the source of each FET being connected to ground, and the gate of each respective FET being arranged to receive the respective modified drive signal.

4. The output stage of claim 1 wherein the drive transistors are connected to their respective supply voltages via a combiner.

5. The output stage of claim 1 further comprising a measurement block adapted to determine a value representing the power dissipated in each drive transistor.

6. The output stage of claim 5, wherein the measurement block is adapted to measure each supply voltage.

7. The output stage of claim 5 wherein the measurement block is adapted to measure the current flowing in each drive transistor.

8. The output stage of claim 5 wherein the measured current and voltage are multiplied to provide a power value.

9. The output stage of claim 5 wherein the measurement block comprises two measurement blocks, one associated with each drive transistor.

10. The output stage of claim 5 further comprising a subtractor for calculating the difference between the power dissipated in each drive transistor, which difference represents an error of the difference between the dissipated power in the drive transistors.

11. The output stage of claim 10 further comprising an error integrator for integrating the error signal, wherein the integrated error signal is provided as the offset signal which is respectively added to or subtracted from the drive signals of the two drive transistors.

12. The output stage of claim 1 further comprising a combiner for combining the first and second output signals to generate a phase combined output signal.

13. The output stage of claim 12 wherein the combiner comprises a transformer, the transformer comprising first and second windings on a first side thereof, one connected between the first drive transistor and the first power supply voltage and the other connected between the second drive transistor and the second power supply voltage, the transformer further comprising a winding on a second side thereof, wherein a voltage is developed in the winding of the second side in dependence of the voltages in the first and second windings.

14. An envelope tracking power supply comprising an output stage according to claim 1.

15. An envelope tracking power supply comprising:

an envelope detector for receiving an input signal to be amplified and for generating an envelope signal representing the envelope of said signal;

a switched mode power supply for selecting one of a plurality of power supply voltages for output as a switched mode power supply in dependence on said envelope signal;

a subtractor for receiving the envelope signal and the output signal and for generating a drive signal representing the difference between such;

a first drive transistor connected to a first power supply voltage via a first winding of a first side of the transformer;

a second drive transistor connected to a second power supply voltage via a second winding of the first side of the transformer;

a phase splitter for receiving the drive signal and generating two parts of the drive signal of opposite phases for driving the first and second drive transistors respectively;

a power measurement block for generating a value representing the power dissipated in each of the drive transistors;

a difference block for generating a signal representing the difference between the generated values representing the power dissipated in each of the drive transistors;

a DC offset signal generator arranged to generate a DC offset signal in dependence on the difference between the generated values;

an adder for adding the DC offset signal to the drive signal for the first transistor to provide a modified drive signal for the first transistor;

a subtractor for subtracting the offset signal from the drive signal for the second transistor to provide a modified drive signal to the second transistor; and a power amplifier for receiving the input signal to be amplified at an input terminal, for generating the output signal at a power supply terminal, and for amplifying the input signal to provide an amplified version thereof.

16. A method of generating an output signal in an output stage comprising:

receiving an input signal and generating first and second drive signals of opposite phase in dependence thereon;

generating a DC offset signal;

adding the DC offset signal to the first drive signal to provide a first modified drive signal;

subtracting the DC offset signal from the second drive signal to provide a second modified drive signal;

generating a first output signal, in a first drive transistor associated with a first power supply voltage, in dependence on the first modified drive signal; and generating a second output signal, a second drive transistor associated with a second power supply voltage, in dependence on the second modified drive signal;

wherein the DC offset signal is generated in order to equalise the power dissipated in the first and second transistors.

17. The method of claim 16, further comprising measuring the power dissipated in the two drive transistors and determining the difference between said measurements, and generating the DC offset signal in dependence on said difference.

18. The method of claim 16 further comprising measuring a power representative of the power dissipated in each drive transistor, wherein the measuring includes measuring each supply and measuring the current flowing in each drive transistor.

19. The method of claim 18 wherein the measured current and voltage are multiplied to provide a power value.

20. The method of claim 19 further comprising: calculating the difference between the power dissipated in each drive transistor, which difference represents an error of the difference between the dissipated power in the drive transistors; integrating the error signal; and providing the integrated error signal as the offset signal which is respectively added to or subtracted from the drive signals of the two drive transistors.

* * * * *